United States Patent [19]
Grant et al.

[11] Patent Number: 5,234,540
[45] Date of Patent: Aug. 10, 1993

[54] PROCESS FOR ETCHING OXIDE FILMS IN A SEALED PHOTOCHEMICAL REACTOR

[75] Inventors: Robert W. Grant, Excelsior, Minn.; Kevin Torek, State College, Pa.; Richard E. Novak, Plymouth, Minn.; Jerzy Ruzyllo, State College, Pa.

[73] Assignee: SubMicron Systems, Inc., Allentown, Pa.

[21] Appl. No.: 876,043

[22] Filed: Apr. 30, 1992

[51] Int. Cl.[5] ............... B44C 1/22; C03C 15/00; C03C 25/06
[52] U.S. Cl. .................... 156/646; 156/643; 156/657; 156/345
[58] Field of Search ............ 156/643, 646, 657, 662, 156/345; 134/1, 2, 3, 31, 39, 102; 252/79.1, 79.3, 79.4

[56] References Cited
U.S. PATENT DOCUMENTS

| | | | |
|---|---|---|---|
| 5,022,961 | 6/1991 | Izumi et al. | 156/646 |
| 5,078,832 | 1/1992 | Tanaka | 156/646 X |
| 5,112,437 | 5/1992 | Watanabe et al. | 156/646 |

*Primary Examiner*—William A. Powell
*Attorney, Agent, or Firm*—Hugh D. Jaeger

[57] ABSTRACT

A process for etching oxide films on the semiconductor, or other substrates, in a sealed photochemical reactor. Anhydrous hydrogen fluoride (AHF) gas, or other halogen containing gases, and alcohol vapor carried by an inert gas, such as nitrogen, are passed over the oxides to be etched. The UV radiation shines through a window, which passes the UV radiation onto the oxides while the gases are flowing, and enhances and controls etching of the oxides. The UV window is impervious to the etch process gases. The etch rates are modified, providing for improved oxide etching characteristics.

1 Claim, 1 Drawing Sheet

PROCESS FOR ETCHING OXIDE FILMS IN A SEALED PHOTOCHEMICAL REACTOR

BACKGROUND OF THE INVENTION

1. Field of the Invention

The present invention pertains to front-end-semiconductor processing, and more particularly, pertains to a process for etching of an oxide film on the semiconductor or other substrates.

2. Description of the Prior Art

In front-end processing of semiconductors during etching operations, it has always been a problem to remove oxides at an appropriate rate in etch processes without etching excessive amounts of the other films on the semiconductor substrate, while also not adding moisture to the gas stream at the same time. Such oxide types are borophosphate silicate glass, spun on glass, sputtered, chemical vapor deposited, thermal, or native/chemically grown (incidental). It has always been a problem to etch the desired thickness of these oxides at about room temperature and atmospheric pressures without attacking other materials which are to remain on the substrate, such as in prior art methods, such as HF gas, HF gas plus water vapor or HF gas and alcohol.

The present invention overcomes the problems of the prior art etch processes, by providing a process using HF gas, or other halogen containing gases, and alcohol in combination with UV radiation.

SUMMARY OF THE INVENTION

The general purpose of the present invention is to provide ultraviolet stimulation in the wavelength range of 150–600 nanometers for the etching of oxide films on semiconductor or other substrates in front-end fabrication, using gaseous anhydrous hydrogen fluoride (AHF), and alcohol vapor chemistry. The purpose of the ultraviolet radiation is to enhance and control the etch process of various oxides, and also eliminate the need to supply water vapor to the reaction chamber, which alleviates the corrosion concerns associated with the prior art processes.

According to one embodiment of the present invention, there is provided a process for etching of an oxide film on a semiconductor substrate comprising the steps of passing gaseous anhydrous hydrogen fluoride (AHF) and alcohol vapor chemistry under ultraviolet radiation in the wavelength range of 150–600 nanometers across a semiconductor substrate with oxides to control the etch rate of the oxides, thereby eliminating water vapor from the process gases and minimizing corrosion without compromising etch characteristics.

Significant aspects and features of the present invention include etching of oxide films on semiconductor substrates to control oxide etch rates, while at the same time minimizing use of water vapor, and hence, corrosion concerns.

Another significant aspect and feature of the present invention is etch rates which are far and above those etch rates previously experienced by prior art etch processes.

Having thus described the embodiments of the present invention, it is a principal object hereof to provide a process for etching of oxide films on semiconductor or other substrates utilizing gaseous anhydrous hydrogen fluoride (AHF), or other hydrogen containing gases, and alcohol vapor chemistry under ultraviolet radiation in the wavelength of 150–600 nanometers.

One object of the present invention is a process for etching of oxide films on a semiconductor substrate in a dry cluster tool, such as that disclosed and claimed in U.S. patent application entitled "Cluster Tool Dry Cleaning System" by Robert Grant et al., U.S. Ser. No. 07/820,985, filed Jan. 15, 1992, and incorporated herein by reference.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
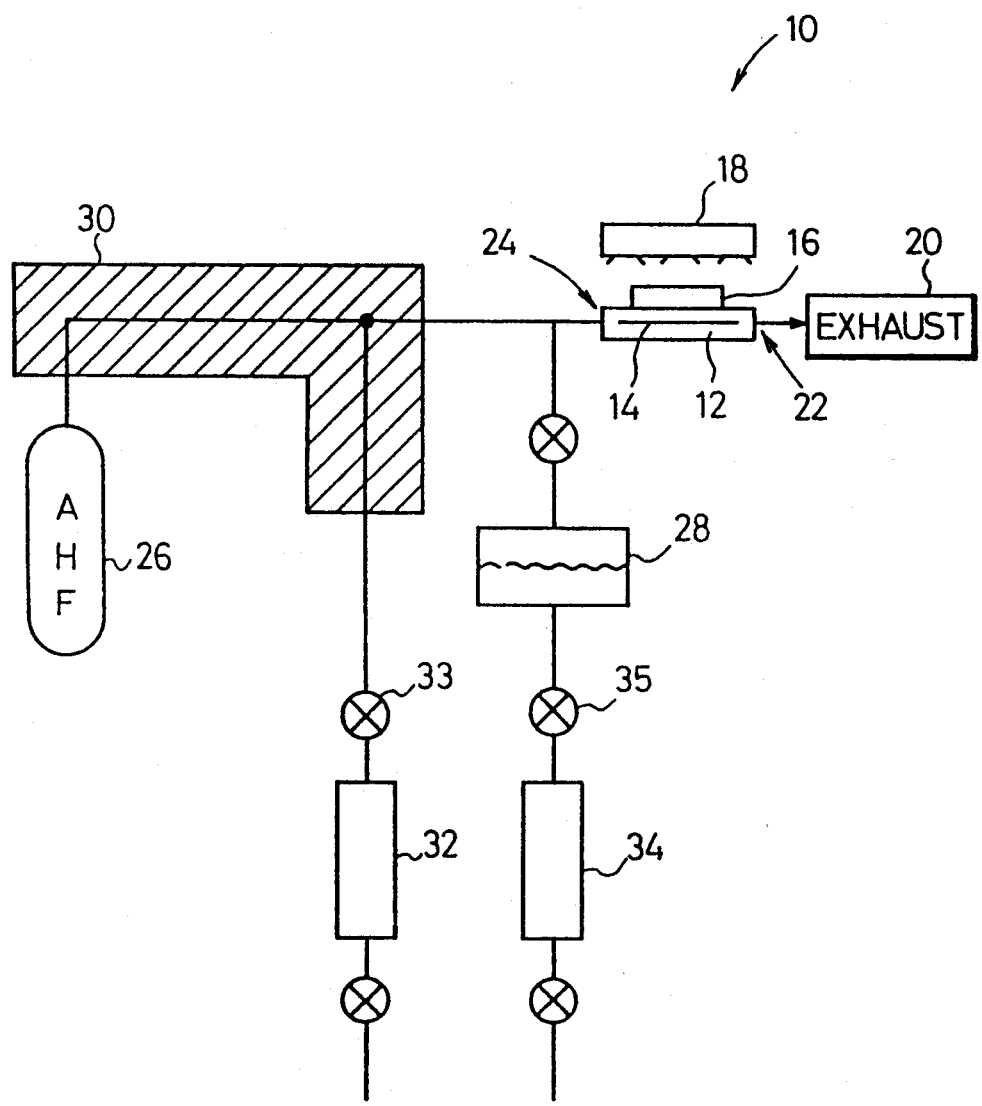
FIG. 1 illustrates a schematic diagram of apparatus for the process for etching of an oxide film on a semiconductor substrate.

FIG. 1 illustrates a schematic view of an apparatus for performing the process for etching oxide films on a semiconductor or other substrate. A chamber 12 is of sufficient size to accommodate such substrate 14 with at least one oxide film thereon to be etched. A UV window 16 passes ultraviolet radiation in a range of 150–600 nanometers, which is radiated by an ultraviolet generator lamp 18, by way of example and for purposes of illustration only and not to be construed as limiting of the present invention. Connected to the chamber 12 is an exhaust port 20 at the outlet end 22. At an inlet end 24, are sources of gaseous anhydrous hydrogen fluoride (AHF) from a cylinder 26 and alcohol vapor from an alcohol bubbler 28. An optional heater 30 can heat the gaseous anhydrous hydrogen fluoride 26 to increase the cylinder pressure of the AHF liquefied gas and/or to prevent the AHF gas from condensing as it expands through orifices in the gas delivery system by actuation of valve 33. An optional nitrogen source 34 also carries the alcohol vapor through the alcohol bubbler 28 by actuation of valve 35.

MODE OF OPERATION

A substrate with the oxide or oxides is placed in a sealed photochemical reactor used in a stand-alone unit or as a part of a dry cluster tool as that disclosed in the referenced patent application.

The etching of the oxide film or films on the semiconductor or other substrates by the gaseous anhydrous hydrogen fluoride (AHF) is controlled by the alcohol vapor, with the AHF and alcohol chemistry subjected to the ultraviolet radiation in the wavelength range of 150–600 nanometers. The ultraviolet radiation enhances and controls the etch rates of the oxide or oxides while also substantially eliminating or eliminating the water vapor from the process gases, and by doing this, minimizing or negating corrosion concerns.

Various modifications can be made to the present invention without departing from the apparent scope hereof.

I claim:

1. Process for etching at least one oxide film on the semiconductor or other substrates comprising the steps of:
   a. placing a substrate in a stand-alone chamber or chamber connected to a cluster tool;
   b. simultaneously or sequentially passing gaseous anhydrous hydrogen fluoride, or other halogen containing gases, and alcohol vapor through said chamber; and,
   c. illuminating the interior of said chamber with ultraviolet radiation.

* * * * *